(12) United States Patent
Edelstein

(10) Patent No.: US 11,833,843 B2
(45) Date of Patent: Dec. 5, 2023

(54) ISOLATED PRINT MEDIUM DISPENSER

(71) Applicant: ASMPT SMT SINGAPORE PTE. LTD., Singapore (SG)

(72) Inventor: Jason Mark Edelstein, Weymouth (GB)

(73) Assignee: ASMPT SMT SINGAPORE PTE. LTD., Singapore (SG)

(*) Notice: Subject to any disclaimer, the term of this patent is extended or adjusted under 35 U.S.C. 154(b) by 0 days.

(21) Appl. No.: 17/368,908

(22) Filed: Jul. 7, 2021

(65) Prior Publication Data
US 2022/0032667 A1 Feb. 3, 2022

(30) Foreign Application Priority Data
Jul. 30, 2020 (GB) .................................. 2011854

(51) Int. Cl.
*B41J 29/13* (2006.01)
*B41J 23/26* (2006.01)
*B41J 29/02* (2006.01)

(52) U.S. Cl.
CPC ............... *B41J 29/13* (2013.01); *B41J 23/26* (2013.01); *B41J 29/02* (2013.01)

(58) Field of Classification Search
None
See application file for complete search history.

(56) References Cited

U.S. PATENT DOCUMENTS

| | | | |
|---|---|---|---|
| 6,363,846 B1 | 4/2002 | Murakami | 101/126 |
| 8,767,025 B2 | 7/2014 | Usui | |
| 2009/0280971 A1 | 11/2009 | Kunz | 483/3 |
| 2011/0192296 A1 | 8/2011 | Kim | 101/127.1 |
| 2019/0143668 A1* | 5/2019 | Bareham | B41F 15/42 |
| | | | 101/126 |

FOREIGN PATENT DOCUMENTS

| | | |
|---|---|---|
| CN | 109878201 A | 6/2019 |
| EP | 3 482 940 A1 | 5/2019 |
| JP | H02-255449 A | 10/1990 |
| JP | H05-011920 A | 1/1993 |
| JP | H11-78164 A | 3/1999 |
| JP | 2009-269164 A | 11/2009 |
| JP | 2010-062340 A | 3/2010 |
| JP | 2010-142957 A | 7/2010 |
| JP | 2011-016339 A | 1/2011 |
| JP | 2014-024196 A | 2/2014 |
| JP | 2014-087989 A | 5/2014 |
| JP | 2017-140817 A | 8/2017 |
| JP | 2018-118407 A | 8/2018 |
| JP | 2019-089327 A | 6/2019 |
| TW | 201811491 A | 4/2018 |
| WO | WO 2019/225002 A1 | 11/2019 |
| WO | WO-2020202919 A1 * | 10/2020 ............ B41J 15/048 |

OTHER PUBLICATIONS

Oguchi, T, Printer, Oct. 8, 2020, Japan, All Pages (Year: 2020).*

* cited by examiner

*Primary Examiner* — Justin Seo
*Assistant Examiner* — Tracey M Mcmillion
(74) *Attorney, Agent, or Firm* — OSTROLENK FABER LLP

(57) ABSTRACT

A printing machine includes a sliding carriage to provide isolation between internal volumes, to enable a print medium container to be exchanged without disrupting a print operation. Convective air flow between the volumes is maintained during normal operation.

10 Claims, 4 Drawing Sheets

ISOLATED PRINT MEDIUM DISPENSER

BACKGROUND AND PRIOR ART

Industrial screen-printing machines typically apply print media, such as solder paste or conductive ink, onto a planar workpiece, such as a wafer or circuit board, by applying the print medium (e.g. solder paste) through a pattern of apertures in a screen (sometimes referred to as a foil or a stencil) using an angled blade or squeegee. The print medium is conventionally stored in a cartridge or pot, and is dispensed from the bottom of this by applying pressure to the top, using a pressurised air source. The cartridge is mounted on the print carriage, which also carries the squeegee. Since the print carriage travels along the length (i.e. front to back) of the printing machine, conventionally referred to as the Y direction, the cartridge can dispense to either the front or rear rail of the printing machine. The cartridge is also mounted for movement along the X direction, being normal to the Y axis and in the horizontal plane, relative to the print carriage. In operation therefore, the print carriage is moved to one end of the printing machine, and the cartridge is caused to dispense print medium while travelling along the X direction, so that print medium is dispensed to form an approximately linear bead of medium onto the printing screen. Because of the lack of space available within the printing machine, the cartridge may be rotatable between a horizontal orientation when it is not dispensing, and a vertical orientation for dispensing.

The quantity of print medium present in the cartridge can be detected by a sensor, and an operator alerted when the cartridge requires replacement.

There is a problem however that in order to effect replacement of a cartridge, it is necessary to open up the printing machine to obtain access to the cartridge. FIG. 1 schematically shows a known printing machine 1 in a perspective view. The printing machine 1 is substantially cuboid, having an external housing 2 which covers the printing machine 1 to prevent unauthorised access to the interior of the printing machine 1. The housing is mounted on a frame (not visible in FIG. 1), which also supports internal machinery and components. A hood 3 is provided to enable authorised access. This is connected to the remainder of the housing 2 via a hinge 4, so that the hood 3 can be lifted up and rested on top of the housing. To further increase the safety of the printing machine 1, an interlock (not shown) may be provided, which must be enabled prior to opening the hood 3.

For safety reasons it is necessary that the printing operation is shut down whenever the hood 3 of the printing machine 1 is opened, including when opened for the purpose of replacing a cartridge. This means that the print cycle is interrupted every time a cartridge is changed, which adds time to, and decreases efficiency of, the print process.

To address these problems, a printing machine having an isolated paste dispenser was developed, which is described in EP3482940A1, and illustrated in FIG. 2. The printing machine 10, has an external housing 11 supported on a frame. A hood 12 provides access the interior of the printing machine 10. In addition, a separate hatch 13 is provided, which may be opened by lifting it about a hinge 14 connecting the hatch 13 to the housing 11.

FIG. 3 schematically shows the interior of printing machine 10, i.e. with the hood 12 and hatch 13 removed for clarity. In addition, and again for clarity, much of the printing machinery, in particular the print carriage, is omitted. The housing 11, and printing machinery and components are supported by frame 15. The internal volume of the printing machine 10 is partially separated into two distinct subvolumes by an internal partition 16: a main volume 17 and a container exchange volume 18, which is smaller than the main volume 17. The main volume 17 accommodates the printing machinery, including a print carriage with squeegee. Chases 22A, 22B are shown within the main volume 17, these chases 22A, 22B provide a receptacle for a printing screen S in use. As is known generally in the art, such chases are movable by actuators (not shown) to adjust the distance therebetween, so that a variety of differently-sized printing screens may be held by the chases 22A, 22B in use. During a printing process, a print carriage (not shown), including a squeegee, travels over the receptacle to act on a stencil S retained within, the direction of travel being parallel to the axes of the chases 22A, 22B, this direction conventionally being referred to as the "Y-direction".

The separation between the main volume 17 and the container exchange volume 18 is only partial since partition 16 includes an aperture 21, which permits communication between the two subvolumes. Passing through the aperture 21 proximate the upper edge thereof is a rail 19. Rail 19 extends at least partially across and over the receptacle, and across substantially the width of the printing machine 10, in a direction conventionally being referred to as the "X-direction". Rail 19 is statically fixed relative to the frame 15.

The rail 19 is provided with a shuttle 23 mounted for travel along the rail 19. A cradle 24 is mounted on the shuttle 23 for travel therewith. Cradle 24 is adapted to retain a container for print medium (not shown). This container could for example comprise a cartridge or paste pot. It can be seen that shuttle 23 and cradle 24 are sized so as to fit through the aperture 21, so that they may travel into the main volume 17, and along the length of rail 19. The shuttle 23 includes a wall section 20 dimensioned so as to fit within a and substantially close the aperture 21 when aligned with the internal partition 16 through corresponding positioning of the shuttle 23 along the rail 19. When so positioned, the shuttle 23 is considered to be at an "exchange" position in which a print medium container carried by within cradle 24 may be exchanged.

In use therefore, when it is desired to exchange the print medium container, the shuttle 23 is moved to the exchange position in which the all section 20 aligns with internal partition 16. The hatch 13 is then opened, and the print medium container may safely be exchanged. Safety is ensured since the container exchange volume is physically separated from the main volume 17 by the combination of internal partition 16 and wall section 20. Furthermore, during exchange, the printing operation can continue without interruption.

However, a problem exists with this apparatus in that heat exchange within the printing machine 10 is adversely affected by the internal partition 16 and wall section 20. In other words, air is prohibited from circulating freely within the entire interior of the machine, and so it becomes more difficult to maintain an optimum operating temperature within the main volume 17. In addition, the opening of hatch 13 is a relatively difficult operation for an autonomous intelligent vehicle (AIV) to perform, which may hinder factory automation.

The present invention seeks to overcome these problems, and provide an alternative configuration which allows isolation between a main volume of a printing machine and an exchange volume, while also permitting improved thermal convection and automation potential.

In accordance with the present invention this aim is achieved by providing isolation not through the use of a movable wall on the shuttle, but with new design of sliding hatch.

SUMMARY OF THE INVENTION

In accordance with a first aspect of the present invention there is provided a printing machine comprising:
a housing,
a first internal volume within the housing, containing printing equipment for printing a print medium onto a workpiece, the printing equipment including a print head, a receptacle for a printing screen and a support for a workpiece,
a second internal volume within the housing, and
a shuttle adapted to retain a container of print medium, the shuttle being movable between the first internal volume and the second internal volume,
wherein the housing comprises a carriage movable between a closed position and an open position, the carriage comprising a side wall which, when the carriage is located at the closed position, is located at a side of the second internal volume distal to the first internal volume and which, when the carriage is located at the open position, lies intermediate the first internal volume and the second internal volume to provide at least partial isolation therebetween.

Other specific aspects and features of the present invention are set out in the accompanying claims.

BRIEF DESCRIPTION OF THE DRAWINGS

The invention will now be described with reference to the accompanying drawings (not to scale), in which.

DETAILED DESCRIPTION OF THE PREFERRED EMBODIMENTS OF THE INVENTION

Figure 4:
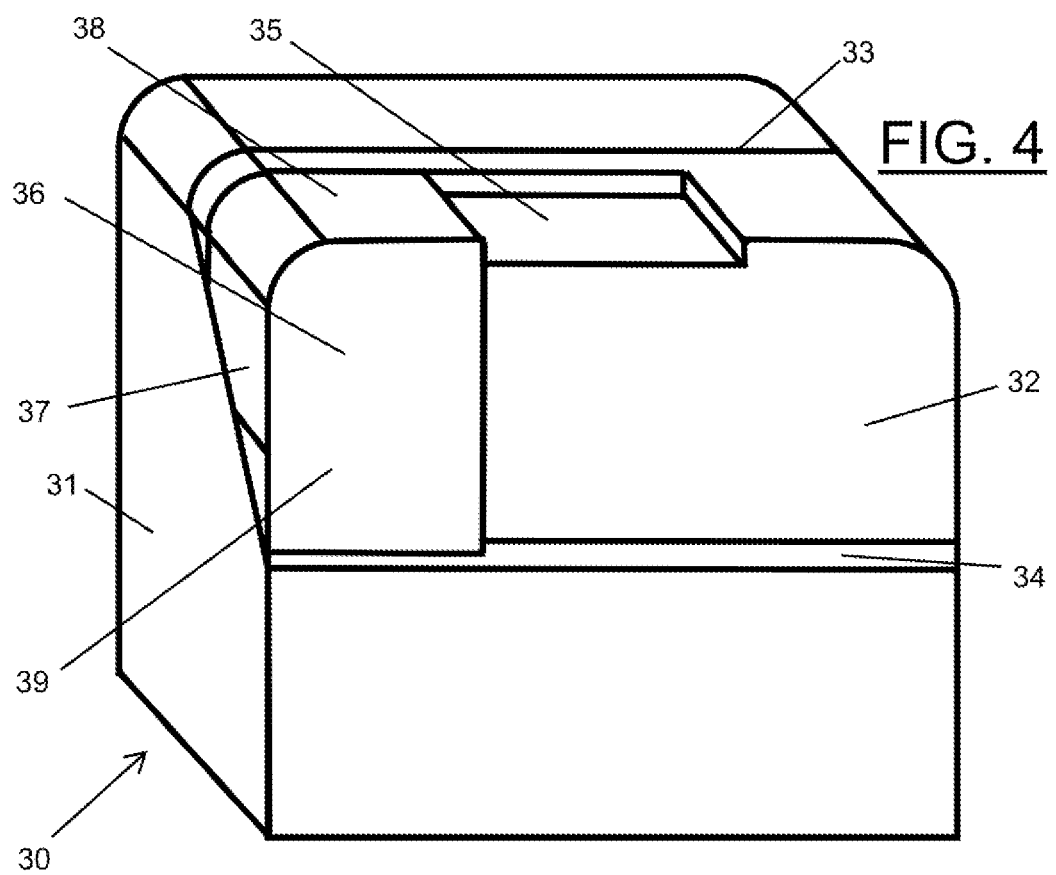
FIG. 4 schematically shows a perspective view of a printing machine with an isolated paste dispenser in accordance with the present invention, in a closed configuration.

A printing machine 30 according to an embodiment of the present invention is shown in perspective view in FIG. 4. The outline shape of the printing machine 30 is defined by a housing 31, which is supported by an internal frame 40 (see FIG. 5), and in this embodiment has an approximately cuboid form. For clarity, the openings through which a workpiece may enter and leave the printing machine 30 are not shown, but these would typically be located on the left and right lateral sides of the housing 31 as shown. The housing could for example be formed from a rigid plastics or material, optionally with panels of glass or transparent plastics materials. The housing 31 includes a hood 32 which forms the upper part of the entire front side of the housing 31 (i.e. the side closest to the viewer in FIG. 4), the hood 32 shown here being of substantially triangular cross-sectional shape. The hood 32 is pivotably mounted to the rest of the housing 31 via a hinge 33 on the top of the housing 31, so that the hood 32 can be lifted up between a closed configuration as shown in FIG. 4 in which the hood 32 blocks access to the interior of the printing machine 30, and an open configuration (not shown) in which the interior of the printing machine 30 is accessible from outside, so as to, for example, enable an operator to view a printing operation being performed, or perform maintenance or renewal of internal components. At the front side of the housing 31, the hood 32 carries at its lowest extent a track 34, which runs across the front side of the housing 31. In the embodiment shown, the track 34 runs across the entire extent of the front side to provide a clean appearance, but this is not essential from a technical consideration. The top of the hood 32 includes a recess 35 formed therein, which is dimensioned to accommodate a carriage 36 of hood 32, as described in more detail below. Carriage 36 includes three mutually orthogonal external walls: side wall 37, top wall 38 and front wall 39, which define a corner of the housing 31 when the carriage 36 is in the closed position shown in FIG. 4. The carriage 36 is movable along the track 34, so that it can be slid to the right as shown to an open position shown in FIG. 6, with the top wall 38 being received within recess 35.

Figure 5:
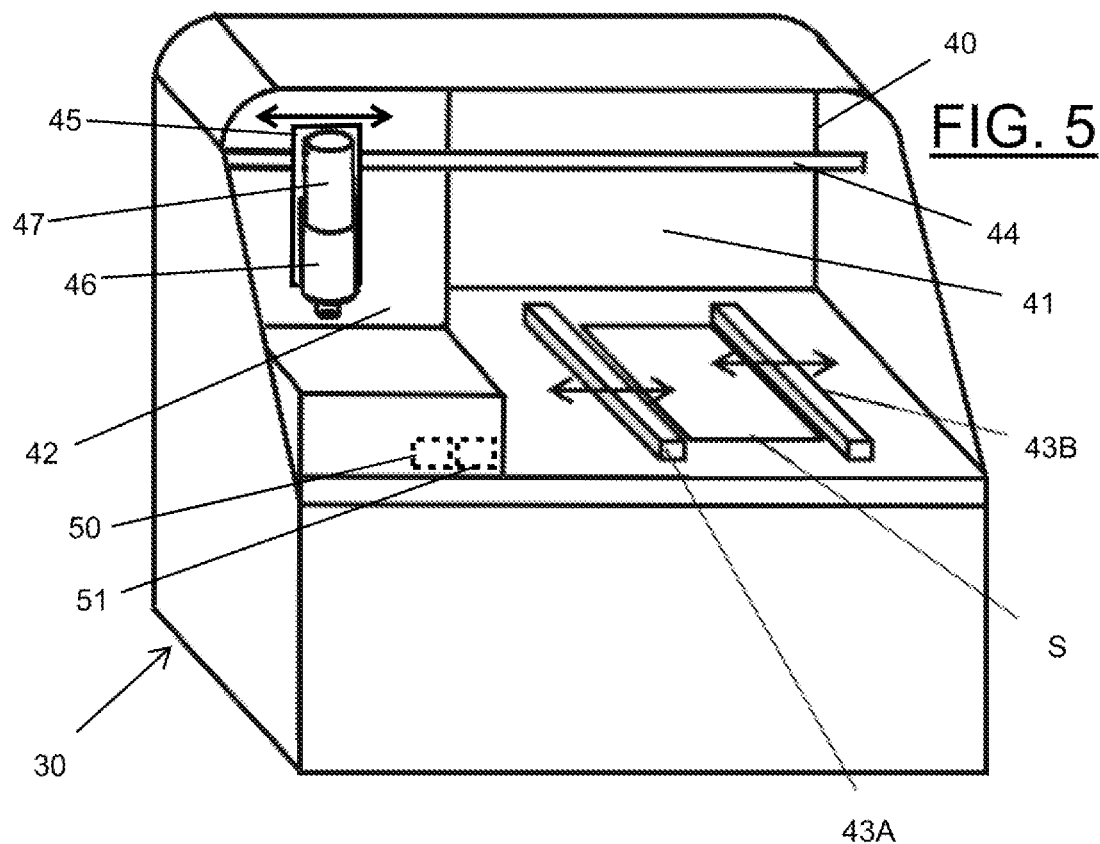
FIG. 5 schematically shows a perspective view of the interior of the printing machine of FIG. 4.

FIG. 5 schematically shows a perspective view of the interior of the printing machine of FIG. 4, with hood 32 removed for clarity. In addition, and again for clarity, much of the printing machinery, in particular the print head, is omitted. The housing 31, and printing machinery and components are supported by frame 40. The internal volume of the printing machine 30 may be considered to constitute two distinct subvolumes: a first, main volume 41 and a second, container exchange volume 42, which as shown is smaller than the main volume 41. Furthermore, there is no barrier between the volumes 41, 42, and so air is able to flow freely between the volumes 41, 42, improving heat heat regulation in the volumes 41, 42 by convection. The main volume 41 accommodates the printing machinery, including a print head (not shown) with squeegee. Chases 43A, 43B are shown within the main volume 41, these chases 43A, 43B provide a receptacle for a printing screen S in use. As is known generally in the art, such chases are movable by actuators (not shown) to adjust the distance therebetween, so that a variety of differently-sized printing screens may be held by the chases 43A, 43B in use. During a printing process, a print head, including a squeegee, travels over the receptacle to act on a stencil S retained within, the direction of travel being parallel to the axes of the chases 43A, 43B, this direction conventionally being referred to as the "Y-direction".

The container exchange volume 42 is located at the same lateral side of the printing machine 30 as the carriage 36 when in its closed position. A rail 44 extends across the internal volume of the printing machine 30, crossing both the container exchange volume 42 and the main volume 41. The rail 44 carries a shuttle 45 which is adapted to retain a container 47 of print medium within a cradle 46. The shuttle 45 is movable along rail 44 between the main volume 41 and the container exchange volume 42. Driving means (not shown) is provided to drive the shuttle 45 along the rail 44, such as a rotary actuator driving a belt, rack and pinion, or worm and wheel drive system, or a linear actuator, with driving being under the control of the main printing machine control system, as is generally known in the art. The shuttle also comprises means for ejecting print medium from the container 47, as is well-known in the art, and so after moving the shuttle 45, and hence container 47 over the printing screen S, a quantity of print medium can then be deposited onto the printing screen S prior to performing a printing operation. Although not particularly clear from FIG. 5, the shuttle 45, cradle 46 and container 47 all sit removed from the front of the printing machine 30, i.e. at or towards the rear of the container exchange volume 42, to avoid impact with the carriage 36, as will be described further below.

Figure 6:
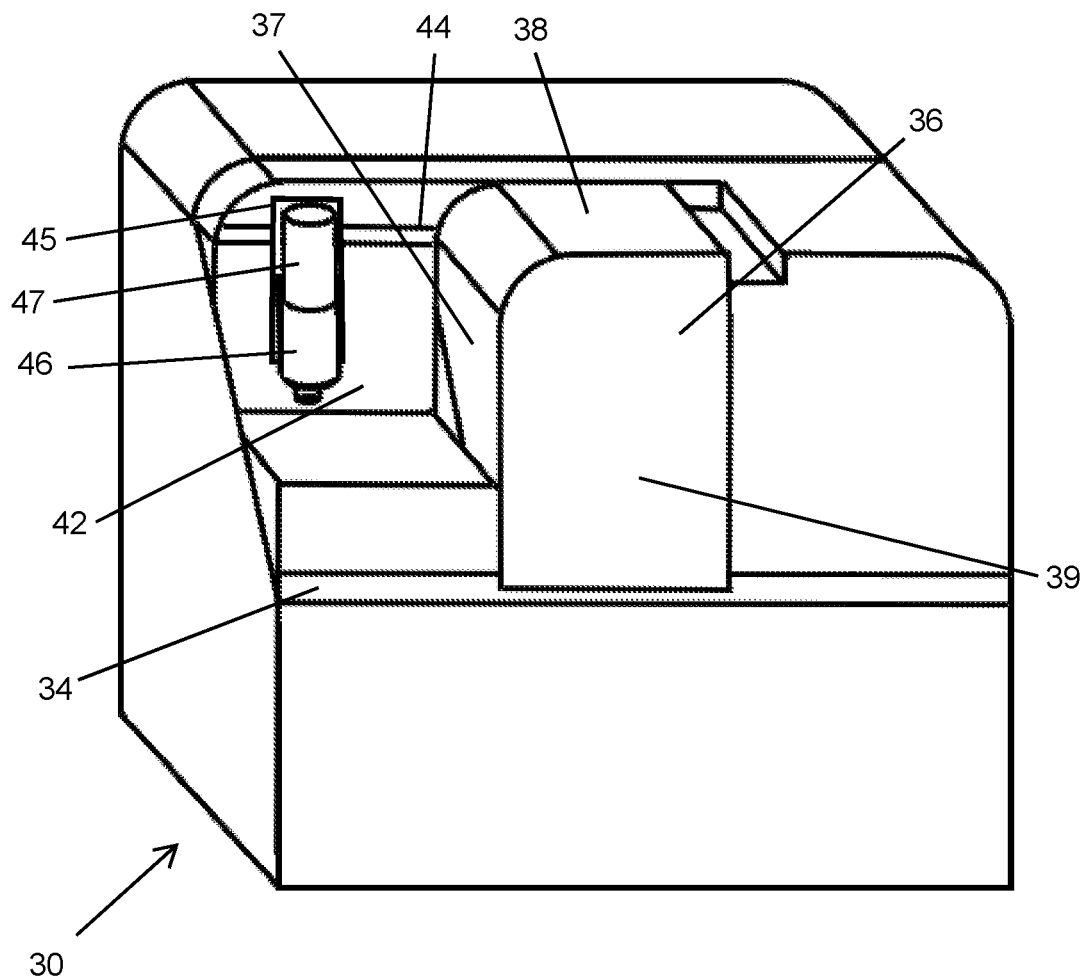
FIG. 6 schematically shows a perspective view of the printing machine of FIG. 4, in an open configuration.

FIG. 6 schematically shows a perspective view of the printing machine 30, in an open configuration. The carriage 36 has been moved from the closed position shown in FIG. 4, in which the side wall 37 is located at a side of the container exchange volume 42 distal to the main volume 41, to an open position in which the side wall 37 lies intermediate the main volume 41 and the container exchange volume 42 to provide at least partial isolation therebetween. The term "partial isolation" used herein means that airflow is restricted between the two volumes 41, 42, but need not be completely prevented. The at least partial isolation when the carriage 36 is in the open position is however extensive enough to prevent an operator from accessing the main volume 41, which action presents a health risk to the operator. It can be seen from FIG. 6 that the side wall 37 defines part of the external surface of the printing machine 30 in both the open and closed positions. In fact, the top wall 38 and front wall 39 also define part of the external surface of the printing machine 30 in both the open and closed positions. As noted previously, the shuttle 45, cradle 46 and container 47 are all located at or towards the rear of the container exchange volume 42, to avoid impact with the side wall 37 of carriage 36 during its travel to the open position.

Moving the carriage 36 to the open position provides access to the container 47 for an operator, so that, for example, an empty container may be exchanged for a full container, without requiring a printing operation ongoing in the main volume 41 to be paused. Of course, the exchange is only possible if the shuttle 45 is located in the container exchange volume 42 when the carriage 36 is moved to the open position. An interlock 51 may therefore be provided to prevent movement of the carriage 36 from the closed position to the open position unless the shuttle 45 is located within the container exchange volume 42 rather than the main volume 41. An interlock may also be provided to prevent movement of the carriage 36 if the hood 32 is not in its closed configuration.

The carriage 36 may be moved between the open and closed positions manually, or may be driven by an actuator 50, such as, for example a rotary actuator driving a belt, rack and pinion, or worm and wheel drive system, or a linear actuator. In this case, a suitable control (not shown) such as a button may be conveniently provided on the housing. Advantageously, such a control could be operable by an autonomous intelligent vehicle (AIV) to assist with process automation. This would be particularly advantageous if the AIV is also operable to perform container exchange.

Figure 1:
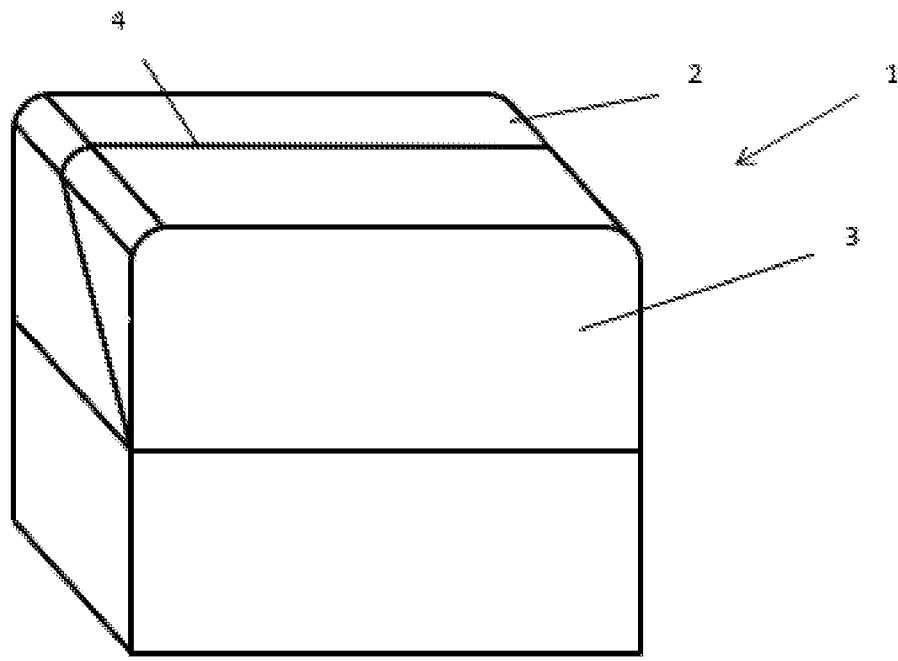
FIG. 1 schematically shows a perspective view of a closed, known printing machine.
Figure 2:
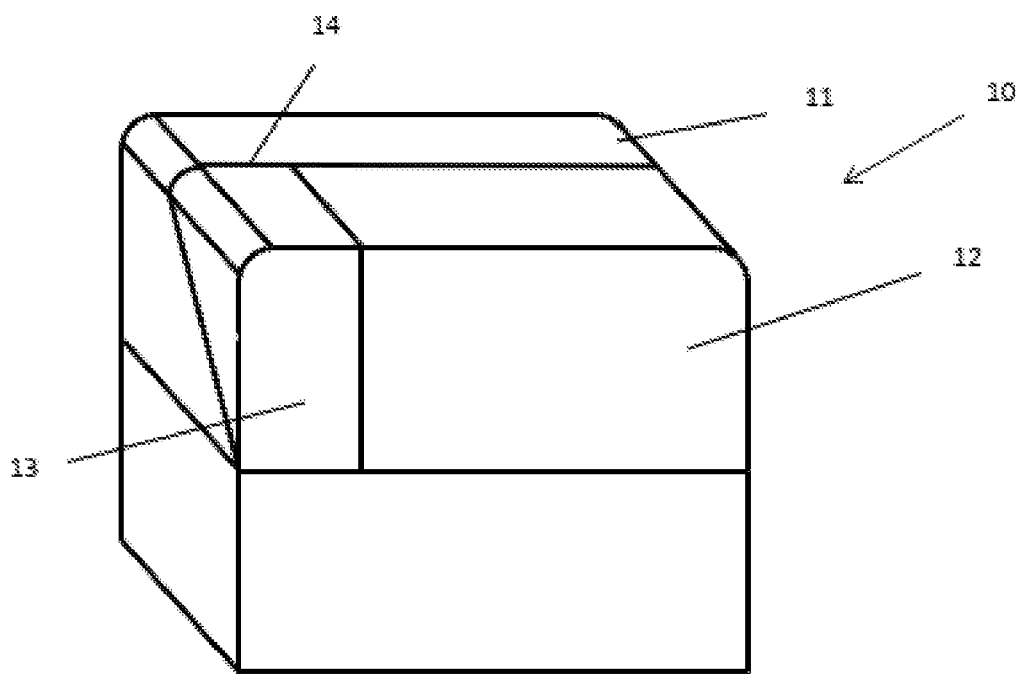
FIG. 2 schematically shows a perspective view of a printing machine with an isolated paste dispenser.
Figure 3:
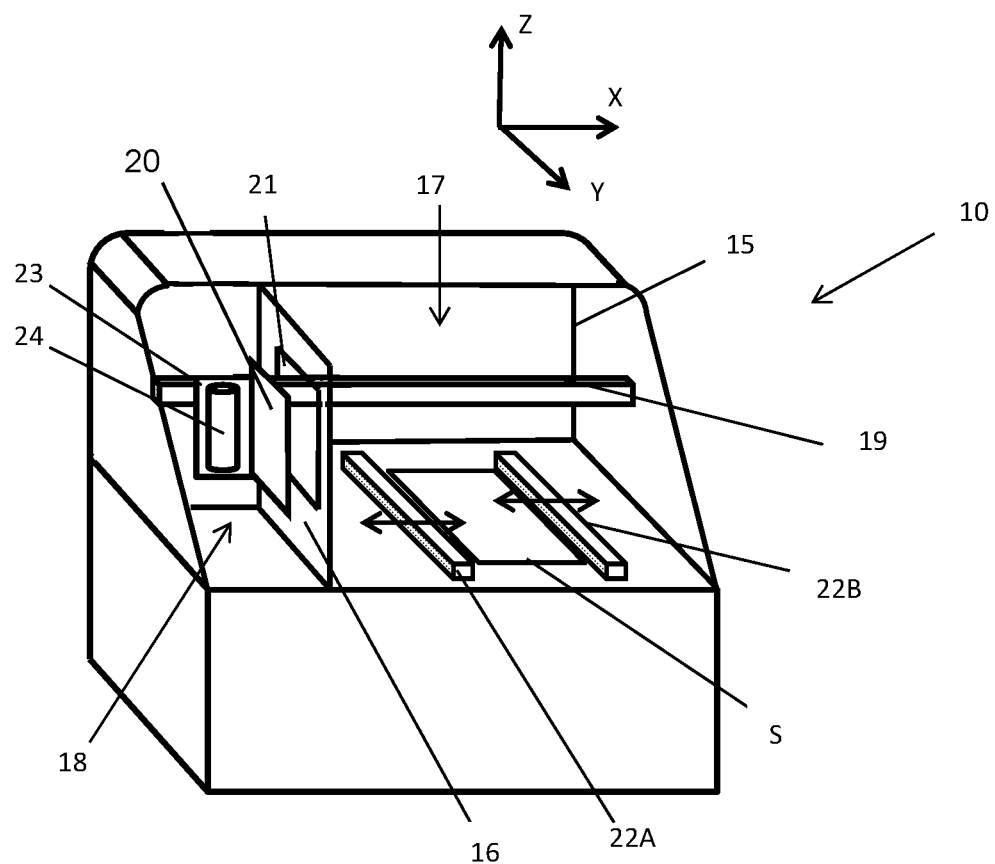
FIG. 3 schematically shows a perspective view of the interior of the printing machine of FIG. 2.

The above-described embodiments are exemplary only, and other possibilities and alternatives within the scope of the invention will be apparent to those skilled in the art. For example, isolation between the main volume and the container exchange volume may be improved if the shuttle includes a wall section, in a somewhat similar manner to the apparatus described with respect to FIG. 3, arranged such that when the shuttle is in the container exchange volume, the wall section provides at least partial isolation between the main volume and the container exchange volume. In this case, when the shuttle is located in the container exchange volume and the carriage is in the open position, the wall section and side wall may align to provide at least partial isolation between the two volumes. Such an embodiment offers the possibility of improved isolation, but with the drawback of permitting reduced convective air flow between the volumes when the carriage is in the closed position.

In the above-described embodiments, the carriage is guided by a track located along the front of the housing. Naturally, support and guidance for the carriage could be provided in a multiplicity of ways, including one or more internal or externally arranged tracks.

REFERENCE NUMERALS USED 1, 10, 30—Printing machine
2, 11, 31—Housing
3, 12, 32—Hood
4, 14, 33—Hinge
13—Hatch
15, 40—Frame
16—Internal partition
17, 41—Main volume
18, 42—Container exchange volume
19, 44—Rail
20—Wall section
21—Aperture
22A, 22B, 43A, 43B—Chases
23, 45—Shuttle
24, 46—Cradle
34—Track
35—Recess
36—Carriage
37—Side wall
38—Front wall
39—Top wall
47—Container
S—Printing screen

The invention claimed is:

1. A printing machine comprising:
  a housing,
  a first internal volume within the housing, containing printing equipment for printing a print medium onto a workpiece, the printing equipment including a print head, a receptacle for a printing screen and a support for a workpiece,
  a second internal volume within the housing, and
  a shuttle adapted to retain a container of print medium, the shuttle being movable between the first internal volume and the second internal volume,
  wherein the housing comprises a carriage movable between a closed position and an open position, the carriage comprising a side wall,
  wherein the carriage is configured so that when the carriage is located at the closed position, the side wall of the carriage is located at a side of the second internal volume distal to the first internal volume to prevent external access to the second internal volume and, when the carriage is located at the open position, the side wall of the carriage lies intermediate the first internal volume and the second internal volume to provide at least partial isolation therebetween.

2. The printing machine of claim 1, wherein the side wall defines part of the external surface of the printing machine in both the open and closed positions.

3. The printing machine of claim 1, wherein the carriage further comprises a front wall orthogonal to the side wall and a top wall orthogonal to both the side wall and the front wall, which define part of the external surface of the printing machine in both the open and closed positions.

4. The printing machine of claim 1, wherein the housing comprises a pivotably mounted hood, and pivotably movable between a closed configuration in which the hood at least partially blocks access to the first internal volume from the exterior of the printing machine, and an open configuration in which the first internal volume is accessible from the exterior of the printing machine.

5. The printing machine of claim 4, wherein the hood comprises the carriage.

6. The printing machine of claim 1, wherein the shuttle includes a wall section, arranged such that when the shuttle is in the second internal volume, the wall section provides at least partial isolation between the first internal volume and the second internal volume.

7. The printing machine of claim 6, wherein, when the shuttle is located in the second internal volume and the carriage is in the open position, the wall section and side wall align to provide at least partial isolation between the first internal volume and the second internal volume.

8. The printing machine of claim 1, wherein the housing comprises a track which supports the carriage and guides its movement between the open and closed positions.

9. The printing machine of claim 1, comprising an actuator operable to move the carriage between the open and closed positions.

10. The printing machine of claim 1, comprising an interlock to prevent movement of the carriage from the closed position to the open position if the shuttle is located within the first internal volume.

* * * * *